United States Patent
Redaelli

(10) Patent No.: US 8,729,522 B2
(45) Date of Patent: May 20, 2014

(54) MEMORY CONSTRUCTIONS COMPRISING THIN FILMS OF PHASE CHANGE MATERIAL

(71) Applicant: Micron Technology, Inc., Boise, ID (US)

(72) Inventor: Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/658,691

(22) Filed: Oct. 23, 2012

(65) Prior Publication Data

US 2014/0110658 A1    Apr. 24, 2014

(51) Int. Cl.
*H01L 29/02*    (2006.01)

(52) U.S. Cl.
USPC ..... 257/4; 257/2; 257/3; 257/5; 257/E29.002; 438/102; 438/103; 438/104; 365/163

(58) Field of Classification Search
CPC ......... H01L 45/04; H01L 29/00; H01L 27/24; G11C 13/0004
USPC .................. 257/1–5, E29.002; 438/102–104; 360/163
See application file for complete search history.

(56) References Cited

U.S. PATENT DOCUMENTS

| | | | |
|---|---|---|---|
| 6,426,891 B1 * | 7/2002 | Katori | 365/175 |
| 8,077,506 B2 | 12/2011 | Lee et al. | |
| 2001/0023119 A1 * | 9/2001 | Reinberg | 438/584 |
| 2006/0266992 A1 | 11/2006 | Matsui et al. | |
| 2007/0115794 A1 | 5/2007 | Lung | |
| 2007/0274121 A1 * | 11/2007 | Lung et al. | 365/148 |
| 2008/0073638 A1 * | 3/2008 | Liu | 257/5 |
| 2010/0163817 A1 | 7/2010 | Savransky et al. | |
| 2013/0032572 A1 * | 2/2013 | Park et al. | 216/53 |

* cited by examiner

*Primary Examiner* — Jami M Valentine
(74) *Attorney, Agent, or Firm* — Wells St. John P.S.

(57) ABSTRACT

Some embodiments include memory constructions having a film of phase change material between first and second materials; with the entirety of film having a thickness of less than or equal to about 10 nanometers. The memory constructions are configured to transit from one memory state having a first phase of the phase change material to a second memory state having a second phase of the phase change material, and are configured so that an entirety of the phase change material film changes from the first phase to the second phase in transitioning from the first memory state to the second memory state. In some embodiments, at least one of the first and second materials may be carbon, W, TiN, TaN or TiAlN. In some embodiments, at least one of the first and second materials may be part of a structure having bands of two or more different compositions.

20 Claims, 2 Drawing Sheets

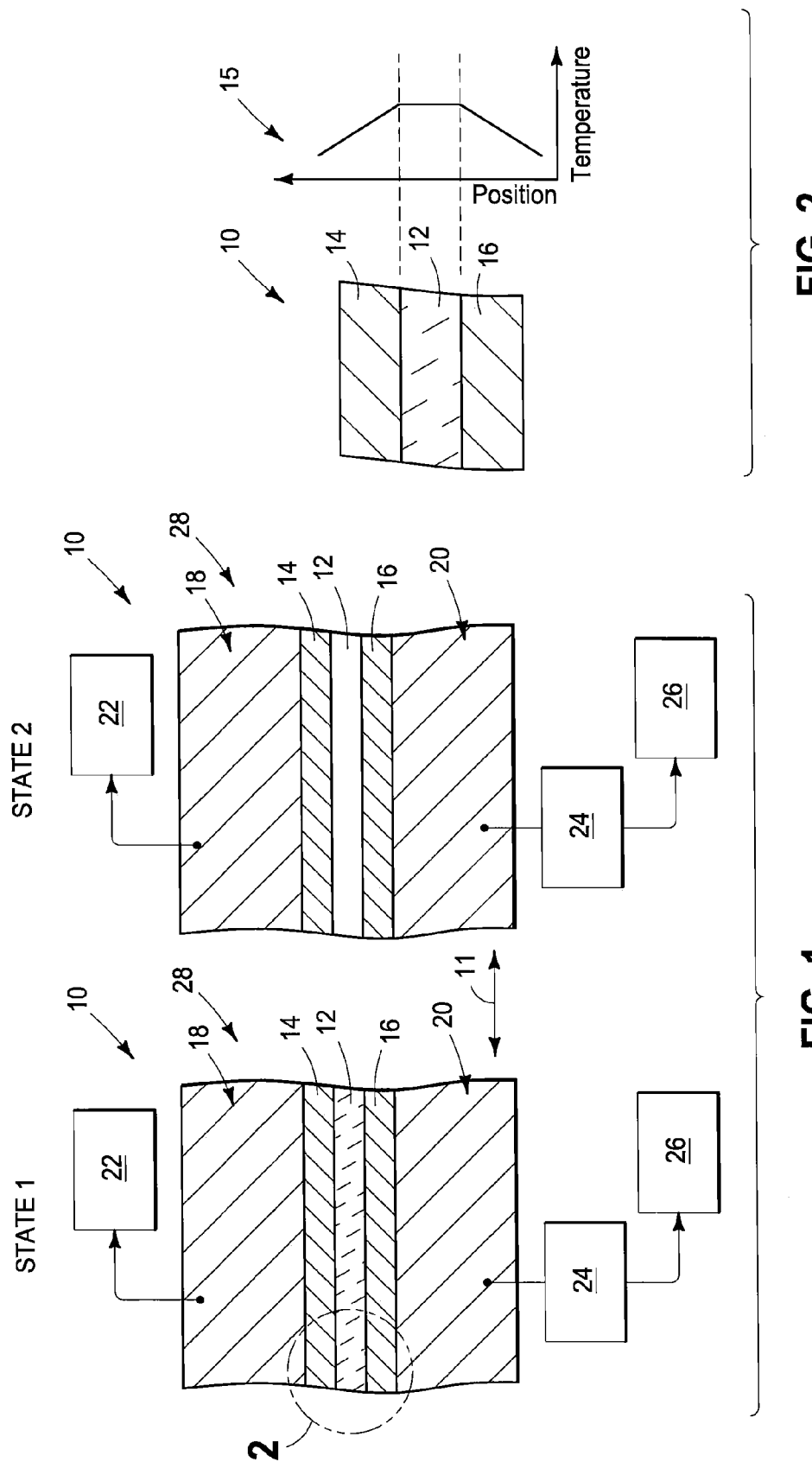

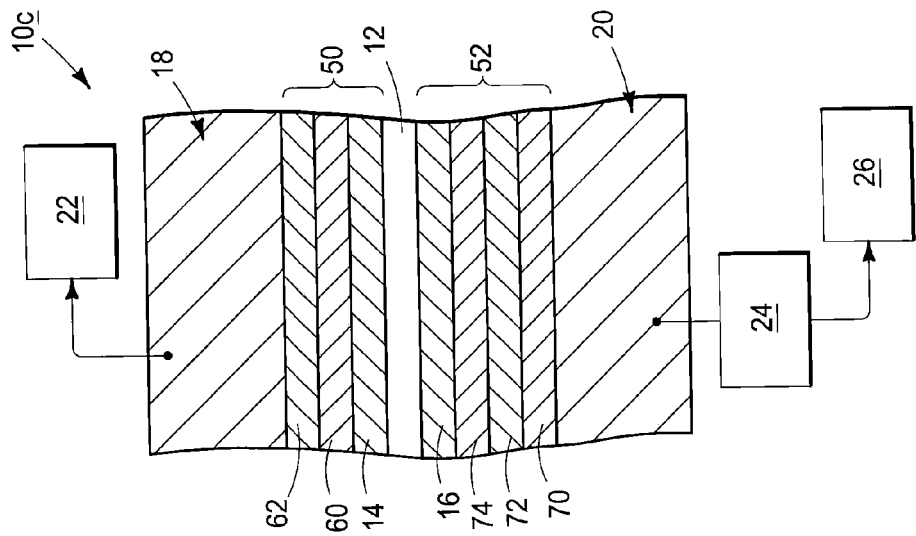
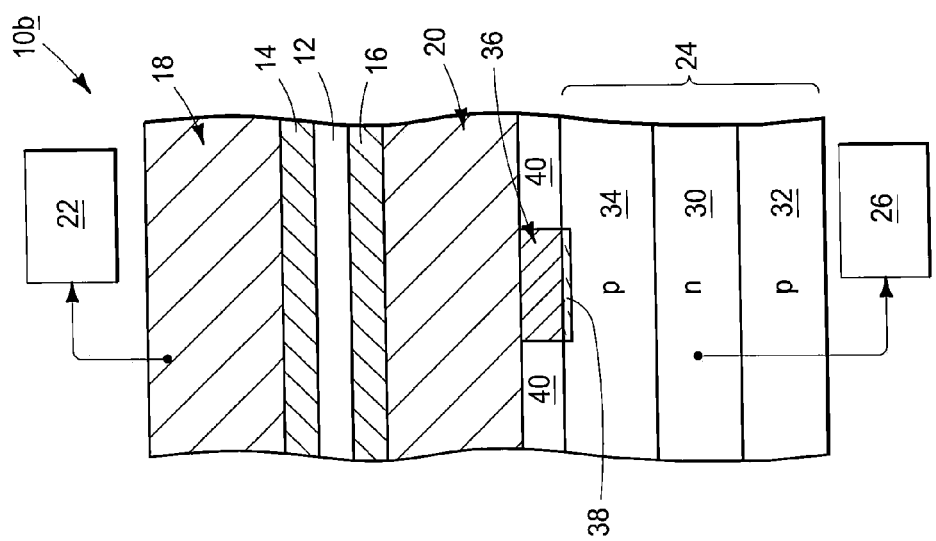

MEMORY CONSTRUCTIONS COMPRISING THIN FILMS OF PHASE CHANGE MATERIAL

TECHNICAL FIELD

Memory constructions.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in structures having programmable material between a pair of electrodes; where the programmable material has two or more selectable resistive states to enable storing of information. Examples of such memory cells are phase change memory (PCM) cells.

PCM cells may comprise selectable memory states corresponding to a high resistance state (HRS) and a low resistance state (LRS). Traditional PCM cells have a phase change material (for instance, a chalcogenide; such as a so-called GST material comprising a mixture of germanium, antimony and tellurium) as the programmable material. In operation, a portion of the phase change material is altered in phase in the HRS state relative to the LRS state. For instance, the portion may be amorphous in one of the states, and crystalline in the other. Accordingly, the PCM cells may be transitioned between the HRS and LRS states by melting a region of phase change material, and then either crystallizing the material or amorphizing the material.

Performance characteristics of a memory cell may degrade over multiple cycles of transitioning between the HRS and LRS states. Accordingly, it is desired to develop memory cells which may have improved endurance.

BRIEF DESCRIPTION OF THE DRAWINGS

FIG. 1 is a diagrammatic cross-sectional view of an example embodiment memory construction transitioning between two memory states.

FIG. 2 shows an enlarged view of a region of FIG. 1, together with a diagrammatic graph illustrating changes in temperature relative to position within such region.

FIG. 3 is another diagrammatic cross-sectional view of the example embodiment memory construction of FIG. 1 in an example application in which a select device is a PNP BJT.

FIG. 4 is a diagrammatic cross-sectional view of another example embodiment memory construction.

DETAILED DESCRIPTION OF THE ILLUSTRATED EMBODIMENTS

In some embodiments, it is recognized that the degradation of performance characteristics of conventional PCM cells may be due, at least in part, to segregation within phase change material as some regions of the phase change material are melted and others are not. Accordingly, new PCM constructions are developed in which an entirety of the phase change material is changed from one phase to another in transitioning from one memory state to another.

An example embodiment memory construction 10 is shown in FIG. 1; with such construction being shown as it is transitioned from a first memory state (STATE 1) to a second memory state (STATE 2). An arrow 11 is provided to diagrammatically illustrate that the memory cell may be reversibly transitioned between the two memory states.

The memory construction 10 includes a phase change material 12 between a first material 14 and a second material 16.

The phase change material 12 may comprise any suitable composition or combination of compositions; and in some embodiments may comprise one or more of germanium, indium, antimony and tellurium. For instance, in some embodiments the phase change material may comprise a combination of germanium, antimony and tellurium (so-called GST); such as, for example, $Ge_2Sb_2Te_5$. As another example, in some embodiments the phase change material may comprise a combination of indium, antimony and tellurium (so-called IST).

The memory construction is configured so that an entirety of the phase change material 12 changes from one phase to another in transitioning from STATE 1 to STATE 2, and vice versa. Accordingly, the phase change material 12 is shown with crosshatching in STATE 1, and without crosshatching in STATE 2, to indicate that the phase change material has a different phase in STATE 1 than in STATE 2. In some embodiments, the phase change material may be crystalline in STATE 1 and amorphous in STATE 2. In such embodiments, STATE 1 may correspond to an LRS memory state and STATE 2 may correspond to an HRS memory state, or vice versa.

The phase change material 12 is formed as a very thin film in order to enable the entirety of the phase change material to be rapidly changed from one state to another. In some embodiments, the phase change material 12 may be formed to be a film having a thickness of less than or equal to about 10 nanometers, or less than or equal to about 5 nanometers. In some embodiments, the phase change material 12 may be a film having a thickness of from about 1 nanometer to about 5 nanometers.

The first and second materials 14 and 16 have higher thermal resistivity than the phase change material 12 to promote rapid thermal change within material 12 and thereby induce rapid phase change of material 12. Preferably, an entirety of material 12 is at a constant temperature during the phase change of material 12, and accordingly any thermal changes present in construction 10 during such phase change will be in other materials of the construction besides the phase change material.

In some embodiments, materials 14 and 16 will be of appropriate composition and thickness so that thermal changes may occur in materials 14 and 16 during the phase change of material 12, while maintaining material 12 at a constant temperature. For instance, FIG. 2 shows an enlarged region of FIG. 1 containing materials 14 and 16, and the phase change material 12 therebetween. FIG. 2 also shows a graph 15 diagrammatically illustrating changes in temperature relative to position within such region during heating of material 12 to induce phase change within such material. The graph 15 shows that materials 14 and 16 are configured to be of appropriate composition and thickness so that temperature changes are within the materials 14 and 16, while the entirety of material 12 is kept at a constant temperature. It is noted that even though the thermal resistance across materials 14 and 16 may be much higher than the thermal resistance across phase change material 12, the electrical resistance across materials 14 and 16 is preferably less than that across phase change material 12 so that performance of memory construction 10 is not limited by electrical conductivity across either the material 14 or the material 16.

The maintaining of the entirety of phase change material 12 at a constant temperature during the phase change within such material, in combination with the utilization of a thin film of phase change material which entirely transforms from one phase to another in transitioning from one memory state to another, can alleviate or prevent the problematic segregation within phase change material that degrades performance of conventional PCM cells. Further, if segregation should occur, the melting of the entirety of film 12 in some embodiments may enable segregated elements to remix. Additionally, the melting of the entirety of film 12 in some embodiments may enable internal stress relaxation to occur within such film which can further improve homogeneity throughout film 12. The mechanisms described herein, possibly in conjunction with other mechanisms not yet fully understood or recognized, may enable the memory construction of FIG. 1 to have improved performance characteristics (for instance, endurance) relative to conventional PCM constructions; and may enable an array of memory constructions to have improved uniformity of operational characteristics (for instance, SET and RESET voltages, etc.) across the array relative to an array of conventional PCM constructions.

The first and second materials 14 and 16 of memory construction 10 may comprise any suitable compositions or combinations of compositions; and in some embodiments may comprise, consist essentially of, or consist of one or more of carbon (for instance, amorphous carbon or any other suitable form of carbon), W, TiN, TaN and TiAlN; where the formulas of the listed compounds indicate the components within the compounds rather than designating specific stoichiometries. In some embodiments, one or both of the first and second materials 14 and 16 may comprise, consist essentially of or consist of carbon, W, TiN, TaN and TiAlN (where the formulas of the listed compounds indicate the components within the compounds rather than designating specific stoichiometries), doped to increase the thermal resistivity of material. The dopant may increase the thermal resistivity by, for example, creating damage regions. Suitable dopant may include one or more of indium, arsenic and germanium. For example, one or both of the first and second materials 14 and 16 may comprise, consist essentially of, or consist of carbon doped with one or more of indium, arsenic and germanium.

The first and second materials may comprise a same composition as one another in some embodiments; and may comprise different compositions relative to one another in other embodiments.

The materials 12, 14 and 16 may be formed by any suitable methodology, including, for example, one or more of atomic layer deposition (ALD), chemical vapor deposition (CVD) and physical vapor deposition (PVD).

As mentioned above, it can be desired that the first and second materials have high thermal resistivity relative to the phase change material. In some embodiments, the materials 14 and 16 may have at least an order of magnitude greater thermal resistivity than the phase change material. In some embodiments, both of materials 14 and 16 have an order of magnitude greater thermal resistivity than the phase change material. In other embodiments, it can be sufficient that only one of the materials 14 and 16 have such high thermal resistivity. In embodiments in which only one of the materials 14 and 16 has such high thermal resistivity, it may be that only one of the materials 14 and 16 comprises, consists essentially of, or consists of a substance selected from the group consisting of carbon, W, TiN, TaN and TiAlN (where the formulas of the listed compounds indicate the components within the compounds rather than designating specific stoichiometries); where such substance may or may not be doped with the above-described dopants.

In the shown embodiment, the material 14 is directly against phase change material 12, and similarly material 16 is directly against phase change material 12. Thus, the materials 14 and 16 are spaced apart from one another by only phase change material 12. Accordingly the materials 14 and 16 are spaced apart by the thickness of material 12. As discussed above, in some embodiments material 12 may have a thickness of less than or equal to about 10 nanometers. Accordingly, in some embodiments materials 14 and 16 may be spaced from one another by less than or equal to about 10 nanometers.

The materials 14 and 16 may comprise any suitable thicknesses; and in some embodiments may have thicknesses of less than or equal to about 10 nanometers, or less than or equal to about 5 nanometers. In some embodiments, the materials 14 and 16 may have about the same thicknesses as one another, and in other embodiments may have different thicknesses than one another.

The memory construction 10 of FIG. 1 comprises a pair of electrically conductive electrodes 18 and 20; with electrode 18 being above material 14, and electrode 20 being below material 16. The electrodes 18 and 20 may be referred to as a top electrode and a bottom electrode, respectively. The electrodes 18 and 20 may comprise any suitable composition or combination of compositions; and in some embodiments may comprise, consist essentially of, or consist of one or more of various metals (for instance, titanium, tungsten, etc.), metal-containing compounds (for instance, metal silicides, metal nitrides, metal carbides, etc.), and conductively-doped semiconductor materials (for instance, conductively-doped silicon, conductively-doped germanium, etc.).

In some embodiments, the top electrode 18 may be electrically coupled with a line (for instance, a sense/access line, such as a bitline), with such line being diagrammatically illustrated by the box 22 in the shown embodiment. The electrode may be part of the line, or may be a structure having a different composition and/or pattern relative to such line.

In some embodiments, the material 14 may be the top electrode of the memory construction, and analogously the material 16 may be the bottom electrode of the memory construction. In such embodiments, the materials 14 and 16 may be formed to be thicker than shown in FIG. 1, and the electrodes 18 and 20 may be omitted.

The bottom electrode 20 is shown to be electrically coupled to a select device (diagrammatically illustrated with a box 24), which in turn may be electrically coupled with a line (diagrammatically illustrated with a box 26). The line 26 may be a sense/access line, such as a wordline.

The select device 24 may comprise any suitable component, such as, for example, a field effect transistor (FET), a diode, or a bipolar junction transistor (BJT). For instance, the select device may correspond to a pedestal of semiconductor material which is appropriately doped with alternating p-type and n-type regions to be configured as a PN diode, an NP diode, a PNP bipolar junction transistor, an NPN bipolar junction transistor, a p-channel FET, or an n-channel FET.

The select device 24 may be omitted in some embodiments, or in some embodiments may be provided in a different location than the shown location between the electrode 20 and the access/sense line 26.

The construction 10 may be supported by a semiconductor substrate (not shown). Such substrate may comprise, consist essentially of, or consist of monocrystalline silicon, or any other suitable semiconductor material. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, the semiconductor substrate may contain one or more materials associated with integrated circuit fabrication. In such embodiments, such materials may correspond to one or more of refractory metal materials, barrier materials, diffusion materials, insulator materials, etc.

The electrodes 18 and 20, together with the materials 12, 14 and 16, form a memory cell 28. Such memory cell may be exemplary of a large number of memory cells fabricated in a memory array across a semiconductor construction. The line 22 may be comprised by a first series of access/sense lines, and the line 26 may be comprised by a second series of access/sense lines. The individual memory cells of the array may be uniquely addressed through combinations of access/sense lines from the first series with access/sense lines from the second series. Accordingly, an electric field gradient may be provided across materials 12, 14 and 16 through utilization of lines 22 and 26 to provide thermal energy to material 12 during programming (i.e., a writing operation) of the memory construction 10. During a reading operation, and resistance between lines 22 and 26 may be utilized to determine if construction 10 is in an LRS configuration or an HRS configuration.

The select device 24 may be utilized to alleviate current leakage that can sometimes problematically occur across an array of PCM cells. As mentioned above, the select device 24 may comprise any of numerous components. FIG. 3 diagrammatically illustrates an example memory construction 10b in which the select device 24 corresponds to a PNP BJT; and specifically comprises an n-type doped region 30 between a pair of p-type doped regions 32 and 34. The electrode 20 may be electrically coupled to the top p-doped region 34 through a conductive plug 36 (for instance, a tungsten plug), and metal silicide 38 (for instance, tungsten silicide or nickel silicide), as shown. In the illustrated embodiment, the plug 36 extends through a dielectric material 40. Such dielectric material may comprise any suitable composition or combination of compositions; including, for example, one or both of silicon dioxide and silicon nitride. The line 26 is electrically connected to the n-type base region of the PNP BJT, while collector 32 is usually grounded.

In some embodiments, the BJT 24 of FIG. 3 may comprise a pillar of conductively-doped semiconductor material (such as, for example, conductively-doped silicon) formed from semiconductor material of a wafer. The dielectric material 40 may be formed over such pillar utilizing ALD and/or CVD. An opening may be formed through such dielectric material to expose doped region 34. The conductive material of plug 36 may be formed within such opening. The silicide 38 may be deposited within the opening prior to formation of plug 36, and/or may result from reaction between conductive material of plug 36 with silicon of region 34. Subsequently, electrode 20, material 16, material 12, material 14 and material 18 may be formed over material 40 and plug 36 utilizing one or more of ALD, CVD and CVD. In some embodiments, all of the processing utilized to form plug 36; electrodes 18 and 20; and materials 12, 14 and 16; may be conducted in a common chamber without breaking vacuum to such chamber.

In some embodiments, material 14 may be considered to be part of a high resistance structure that comprises the material alone, or that comprises such material in combination with other materials. Similarly, in some embodiments material 16 may be considered to be part of a high resistance structure that comprises material 16 alone, or that comprises such material in combination with other materials. FIG. 4 shows an example embodiment memory construction 10c illustrating a configuration in which materials 14 and 16 are both part of high resistance structures comprising additional materials besides the materials 14 and 16. Specifically, the material 14 is part of a high resistance structure 50, and the material 16 is part of a high resistance structure 52. The structure 50 comprises materials 60 and 62 in addition to material 14; and the structure 52 comprises materials 70, 72 and 74 in addition to material 16. In some embodiments, all of the materials 14, 16, 60, 62, 70 and 72 may comprise, consist essentially of, or consist of a substance selected from the group consisting of carbon, W, TiN, TaN and TiAlN (where the formulas of the listed compounds indicate the components within the compounds rather than designating specific stoichiometries). Any of the substances utilized within either the structures 50 and 52 may be doped to enhance damage within such substance; and in some embodiments may be doped with one or more of indium, arsenic and germanium.

In some embodiments, the materials 14, 60 and 62 of structure 50 may all be compositionally different from one another; and in other embodiments the materials 14 and 62 may be the same as one another, and compositionally different from material 60. Similarly, in some embodiments the materials 70, 72, 74 and 16 of structure 52 may all be compositionally different from one another, and in other embodiments at least two of such materials may be the same as one another. The different materials within structure 50 may be referred to as compositionally different bands of such structure; and similarly the different materials of structure 52 may be referred to as compositionally different bands of such structure. Any suitable number of bands may be utilized within the structures 50 and 52.

The illustrated structures 50 and 52 are different from one another, with the structure 52 comprising four bands of different materials (70, 72, 74 and 16), and the structure 50 comprising three bands of different materials (14, 60 and 62). In other embodiments, the structures 50 and 52 may be identical to one another. The utilization of multiple bands in structures 50 and 52 may enable the structures to be tailored for particular applications to achieve a desired thermal gradient across material 12 to induce a transition of material 12 from one phase to another.

The various bands of structures 50 and 52 may be formed to any suitable thicknesses. In some embodiments, all of the bands corresponding to materials 14, 16, 60, 62, 70, 72 and 74 may be formed to thicknesses of less than or equal to about 10 nanometers. In some embodiments, all of such bands may be formed to thicknesses of less than or equal to about 5 nanometers. In some embodiments, all of such bands may be formed to thicknesses of from about 1 nanometer to about 5 nanometers. In embodiments in which all the bands of structures 50 and 52 are formed to thicknesses of less or equal to about 10 nanometers, the structures 50 and 52 may be kept very compact. Such compactness can be desirable for high integration across a memory array.

Although the shown embodiment of FIG. 4 has each of structures 50 and 52 comprising multiple bands of different materials, in other embodiments one of the structures may comprise multiple bands while the other comprises only a single material.

The memory constructions and arrays described herein may be scalable for increasing levels of integration of future architectures. The memory constructions and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory construction, comprising a first material, a film of phase change material over and directly against the first material, and a second material over and directly against the film of phase change material and spaced from the first material by less than or equal to about 10 nanometers. An entirety of the film between the first and second materials has a thickness of less than or equal to about 10 nanometers. The memory construction is configured to transit from one memory state having a first phase of the phase change material to a second memory state having a second phase of the phase change material, and is configured so that an entirety of the phase change material film changes from the first phase to the second phase in transitioning from the first memory state to the second memory state.

Some embodiments include a memory construction comprising a first high thermal resistance structure, a film of phase change material over and directly against the first high thermal resistance structure, and a second high thermal resistance structure over and directly against the film of phase change material. The first and second high thermal resistance structures comprise at least an order of magnitude greater thermal resistivity than the film of phase change material. The memory construction is configured to transit from one memory state having a first phase of the phase change material to a second memory state having a second phase of the phase change material, and is configured so that an entirety of the phase change material film changes from the first phase to the second phase in transitioning from the first memory state to the second memory state.

Some embodiments include a memory construction comprising a first structure, a film of phase change material over and directly against the first structure, and a second structure over and directly against the film of phase change material and spaced from the first structure by less than or equal to about 10 nanometers. At least one of the first and second structures comprises a stack of at least two compositionally different bands. An entirety of the film between the first and second structures has a thickness of less than or equal to about 10 nanometers. The memory construction is configured to transit from one memory state having a first phase of the phase change material to a second memory state having a second phase of the phase change material, and is configured so that an entirety of the phase change material film changes from the first phase to the second phase in transitioning from the first memory state to the second memory state.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory construction, comprising:
   a first material;
   a film of phase change material over and directly against the first material;
   a second material over and directly against the film of phase change material and spaced from the first material by less than or equal to about 10 nanometers;
   wherein an entirety of the film between the first and second materials has a thickness of less than or equal to about 10 nanometers;
   wherein the memory construction is configured to transition from one memory state having a first phase of the phase change material to a second memory state having a second phase of the phase change material, and is configured so that an entirety of the phase change material film changes from the first phase to the second phase in transitioning from the first memory state to the second memory state; and
   wherein at least one of the first and second materials comprises carbon, W, TiN, TaN or TiAlN; where the formulas of the listed compounds indicate the components within the compounds rather than designating specific stoichiometries.

2. The memory construction of claim 1 wherein the first and second materials are a same composition as one another.

3. The memory construction of claim 1 wherein the first and second materials are of different compositions relative to one another.

4. The memory construction of claim 1 wherein at least one of the first and second materials comprises at least about an order of magnitude greater thermal resistivity than the phase change material.

5. The memory construction of claim 1 wherein both of the first and second materials comprise carbon, W, TiN, TaN or TiAlN; where the formulas of the listed compounds indicate the components within the compounds rather than designating specific stoichiometries.

6. The memory construction of claim 1 wherein said at least one of the first and second materials is doped with one or more of indium, arsenic and germanium.

7. A memory construction, comprising:
   a first material;
   a film of phase change material over and directly against the first material;
   a second material over and directly against the film of phase change material and spaced from the first material by less than or equal to about 10 nanometers;
   wherein an entirety of the film between the first and second materials has a thickness of less than or equal to about 10 nanometers;
   wherein the memory construction is configured to transition from one memory state having a first phase of the phase change material to a second memory state having a second phase of the phase change material, and is configured so that an entirety of the phase change material film changes from the first phase to the second phase in transitioning from the first memory state to the second memory state; and
   wherein at least one of the first and second materials comprises carbon.

8. The memory construction of claim 7 wherein both of the first and second materials comprise carbon.

9. A memory construction, comprising:
   a first material;
   a film of phase change material over and directly against the first material;
   a second material over and directly against the film of phase change material and spaced from the first material by less than or equal to about 10 nanometers;
   wherein an entirety of the film between the first and second materials has a thickness of less than or equal to about 10 nanometers;
   wherein the memory construction is configured to transition from one memory state having a first phase of the phase change material to a second memory state having a second phase of the phase change material, and is configured so that an entirety of the phase change material film changes from the first phase to the second phase in transitioning from the first memory state to the second memory state; and
   wherein at least one of the first and second materials consists of carbon doped with one or more of indium, arsenic and germanium.

10. The memory construction of claim 9 wherein both of the first and second materials consist of carbon doped with one or more of indium, arsenic and germanium.

11. The memory construction of claim 9 wherein the phase change material is a chalcogenide comprising one or more of germanium, indium, antimony and tellurium.

12. A memory construction, comprising:
   a first high thermal resistance structure;
   a film of phase change material over and directly against the first high thermal resistance structure;
   a second high thermal resistance structure over and directly against the film of phase change material;
   wherein the first and second high thermal resistance structures comprise at least an order of magnitude greater thermal resistivity than the film of phase change material;
   wherein the memory construction is configured to transition from one memory state having a first phase of the phase change material to a second memory state having a second phase of the phase change material, and is configured so that an entirety of the phase change material film changes from the first phase to the second phase in transitioning from the first memory state to the second memory state; and
   wherein at least one of the first and second high thermal resistance structures comprises one or more of carbon, W, TiN, TaN and TiAlN; where the formulas of the listed compounds indicate the components within the compounds rather than designating specific stoichiometries.

13. The memory construction of claim 12 wherein both of the first and second high thermal resistance structures comprise one or more of carbon, W, TiN, TaN and TiAlN; where the formulas of the listed compounds indicate the components within the compounds rather than designating specific stoichiometries.

14. The memory construction of claim 12 wherein the phase change material is a chalcogenide comprising one or more of germanium, indium, antimony and tellurium; and wherein a thickness of the phase change material is than or equal to about 10 nanometers.

15. The memory construction of claim 14 wherein the thickness of the phase change material is than or equal to about 5 nanometers.

16. A memory construction, comprising:
   a first high thermal resistance structure;
   a film of phase change material over and directly against the first high thermal resistance structure;
   a second high thermal resistance structure over and directly against the film of phase change material;
   wherein the first and second high thermal resistance structures comprise at least an order of magnitude greater thermal resistivity than the film of phase change material;
   wherein the memory construction is configured to transition from one memory state having a first phase of the phase change material to a second memory state having a second phase of the phase change material, and is configured so that an entirety of the phase change material film changes from the first phase to the second phase in transitioning from the first memory state to the second memory state; and
   wherein at least one of the first and second high thermal resistance structures comprises carbon doped with one or more of indium, arsenic and germanium.

17. The memory construction of claim 16 wherein both of the first and second high thermal resistance structures comprise carbon doped with one or more of indium, arsenic and germanium.

18. A memory construction, comprising:
   a first structure;
   a film of phase change material over and directly against the first structure;
   a second structure over and directly against the film of phase change material and spaced from the first structure by less than or equal to about 10 nanometers;
   wherein at least one of the first and second structures comprises a stack of at least two compositionally different bands;
   wherein an entirety of the film between the first and second structures has a thickness of less than or equal to about 10 nanometers;
   wherein the memory construction is configured to transition from one memory state having a first phase of the phase change material to a second memory state having a second phase of the phase change material, and is configured so that an entirety of the phase change material film changes from the first phase to the second phase in transitioning from the first memory state to the second memory state; and wherein each of said at least two bands comprises a substance selected from the group consisting of carbon, W, TiN, TaN and TiAlN; where the formulas of the listed compounds indicate the components within the compounds rather than designating specific stoichiometries.

19. The memory construction of claim 18 further comprising a select device electrically coupled to either the first structure or the second structure.

20. The memory construction of claim 19 wherein the select device is a diode, a field effect transistor or a bipolar junction transistor.

* * * * *